(12) United States Patent
Acharya et al.

(10) Patent No.: US 10,795,334 B2
(45) Date of Patent: Oct. 6, 2020

(54) PATH PLANNING FOR ADDITIVE MANUFACTURING

(71) Applicant: United Technologies Corporation, Farmington, CT (US)

(72) Inventors: Ranadip Acharya, Rocky Hill, CT (US); Abhijit Chakraborty, West Hartford, CT (US); Sergei F. Burlatsky, West Hartford, CT (US); Michael A. Klecka, Coventry, CT (US); Jeffrey Michael Mendoza, Manchester, CT (US)

(73) Assignee: Raytheon Technologies Corporation, Farmington, CT (US)

(*) Notice: Subject to any disclaimer, the term of this patent is extended or adjusted under 35 U.S.C. 154(b) by 261 days.

(21) Appl. No.: 16/050,548

(22) Filed: Jul. 31, 2018

(65) Prior Publication Data

US 2020/0041974 A1 Feb. 6, 2020

(51) Int. Cl.
| | |
|---|---|
| G05B 19/19 | (2006.01) |
| B29C 64/393 | (2017.01) |
| G06F 17/50 | (2006.01) |
| G06F 30/17 | (2020.01) |
| B33Y 10/00 | (2015.01) |
| B33Y 30/00 | (2015.01) |
| B33Y 50/02 | (2015.01) |

(52) U.S. Cl.
CPC ............ *G05B 19/19* (2013.01); *B29C 64/393* (2017.08); *G06F 30/17* (2020.01); *B33Y 10/00* (2014.12); *B33Y 30/00* (2014.12); *B33Y 50/02* (2014.12)

(58) Field of Classification Search
None
See application file for complete search history.

(56) References Cited

U.S. PATENT DOCUMENTS

| 10,661,552 B2* | 5/2020 | Barua ................ B22F 3/1055 |
| 2008/0223832 A1* | 9/2008 | Song .................. B23K 26/34 |
| | | 219/121.66 |
| 2013/0075740 A1* | 3/2013 | Correia Fortunato .................. |
| | | H01L 21/02521 |
| | | 257/63 |

(Continued)

FOREIGN PATENT DOCUMENTS

| WO | 2016/201390 A1 | 12/2016 |
| WO | 2017/074490 A1 | 5/2017 |

OTHER PUBLICATIONS

European Search Report for EP Application No. 19189432.8 dated Dec. 16, 2019.

(Continued)

*Primary Examiner* — Ramesh B Patel
(74) *Attorney, Agent, or Firm* — Carlson, Gaskey & Olds, P.C.

(57) ABSTRACT

A method of providing additive manufacturing includes the steps of (a) developing a plurality of layers to result in a final shape product, (b) developing a space filling algorithm to develop a path, (c) estimating a temperature at a location along the path in an existing direction of the path, and (d) comparing the estimated temperature to a desired temperature and altering the existing direction of the path should the estimated temperature differ from the desired temperature by a predetermined amount. An additive manufacturing system is also disclosed.

20 Claims, 2 Drawing Sheets

(56) References Cited

U.S. PATENT DOCUMENTS

| | | | | |
|---|---|---|---|---|
| 2016/0059493 A1* | 3/2016 | Sparks | ............... | G05B 19/4099 |
| | | | | 700/98 |
| 2017/0212979 A1* | 7/2017 | Cheng | .................... | B33Y 50/00 |
| 2017/0252820 A1* | 9/2017 | Myerberg | ............... | B22F 3/008 |
| 2018/0065309 A1* | 3/2018 | Tyler | ..................... | B29C 64/118 |
| 2018/0117836 A1* | 5/2018 | Reese | ................... | B33Y 70/00 |
| 2018/0117851 A1* | 5/2018 | Reese | ................... | B29C 64/106 |
| 2018/0141123 A1* | 5/2018 | Revanur | ............... | B33Y 50/00 |
| 2018/0169948 A1* | 6/2018 | Coeck | ................... | B33Y 30/00 |
| 2018/0314235 A1* | 11/2018 | Mirabella | .............. | B33Y 50/00 |
| 2019/0001437 A1* | 1/2019 | Mathisen | .............. | B22F 3/1028 |
| 2019/0143412 A1* | 5/2019 | Buller | ................ | G05B 19/4099 |
| | | | | 219/76.12 |
| 2019/0240775 A1* | 8/2019 | Graham | ............. | B23K 26/0876 |

OTHER PUBLICATIONS

Yeung, H., Neira, J., Lane, B., Fox, J. and Lopez, F. (2016). Laser path planning and power control strategies for powder bed fusion systems. Solid Freeform Fabrication 2016: Proceedings of the 27th Annual International Solid Freeform Fabrication Symposium—An Additive Manufacturing Conference. Aug. 2016. pp. 113-127.

Lu, Liang-Xing, Sridhar, N., Zhang, and Yong-Wei. (2017). Phase field simulation of powder bed-based additive manufacturing. Acta Materialia. vol. 144. Dec. 1, 2017. pp. 801-809.

Tang, M., Pistorius, P.C., and Beuth, J.L. (2017). Prediction of lack-of-fusion porosity for powder bed fusion. Additive Manufacturing. vol. 14. Mar. 1, 2017. pp. 39-48.

\* cited by examiner

PATH PLANNING FOR ADDITIVE MANUFACTURING

BACKGROUND

This application relates to a method and control for a system for providing additive manufacturing wherein an initial path may be altered to reduce potential defects.

Additive manufacturing is known. Generally, additive manufacturing is utilized to form complex shapes by depositing material in a plurality of layers. Initially, a 3-D computer model is developed for the final shape. This final shape is then broken into a plurality of 2-D slight "slices" which can then be laid down by an additive manufacturing process to result in a final 3-D product.

A space filling algorithm is utilized which moves through each of the slices with an additive manufacturing tool. As an example, the space filling algorithm may utilize a "lawn mower" approach which deposits material in back and forth paths.

The space filling algorithms are typically developed to simplify ensuring complete coverage and to reduce any inefficient travel. The path is then scanned with the additive manufacturing tool and the part is formed.

SUMMARY

In a featured embodiment, a method of providing additive manufacturing includes the steps of (a) developing a plurality of layers to result in a final shape product, (b) developing a space filling algorithm to develop a path, (c) estimating a temperature at a location along the path in an existing direction of the path, and (d) comparing the estimated temperature to a desired temperature and altering the existing direction of the path should the estimated temperature differ from the desired temperature by a predetermined amount.

In another embodiment according to the previous embodiment, the direction of the path is altered should the estimated temperature be greater than a higher desired temperature.

In another embodiment according to any of the previous embodiments, if the estimated temperature is not greater than the higher desired temperature, the estimated temperature to a lower desired temperature in a second comparison, and altering the direction of the path should the estimated temperature be lower than the lower desired temperature.

In another embodiment according to any of the previous embodiments, a scan speed of movement along the portion is also altered based on the second comparison.

In another embodiment according to any of the previous embodiments, an altered path direction is compared to prior paths, and if the altered path matches the prior paths, then an alternate altered path direction is developed.

In another embodiment according to any of the previous embodiments, an estimated temperature at the altered path is estimated and the method returns to step (d).

In another embodiment according to any of the previous embodiments, a consideration is made of a desired micrograin structure and the path is modified to achieve a desired micrograin structure.

In another embodiment according to any of the previous embodiments, a scan speed of movement along the portion is also altered based on the second comparison.

In another embodiment according to any of the previous embodiments, an altered path direction is compared to prior paths, and if the altered path matches the prior paths, then an alternate altered path direction is developed.

In another embodiment according to any of the previous embodiments, an estimated temperature at the altered path is estimated and the method returns to step (d).

In another embodiment according to any of the previous embodiments, a consideration is made of a desired micrograin structure and the path is modified to achieve a desired micrograin structure.

In another embodiment according to any of the previous embodiments, an altered path direction is compared to prior paths, and if the altered path matches the prior paths, then an alternate altered path direction is developed.

In another embodiment according to any of the previous embodiments, an estimated temperature at the altered path is estimated and the method returns to step (d).

In another embodiment according to any of the previous embodiments, a consideration is made of a desired micrograin structure and the path is modified to achieve a desired micrograin structure.

In another featured embodiment, an additive manufacturing system includes an additive manufacturing tool and a control for the additive manufacturing tool. The control is programmed to develop a plurality of layers to result in a final shape product, develop a space filling algorithm to develop a path, estimate a temperature at a location along the path in an existing direction of the path, and compare the estimated temperature to a desired temperature and altering the existing direction of the path should the estimated temperature differ from the desired temperature by a predetermined amount.

In another embodiment according to the previous embodiment, the control is programmed to alter the direction of the path should the estimated temperature be greater than a desired temperature.

In another embodiment according to any of the previous embodiments, the control is programmed so that if the estimated temperature is not greater than the higher desired temperature, it compare the estimated temperature to a lower desired temperature, and alters a path should the estimated temperature be lower than the lower desired temperature.

In another embodiment according to any of the previous embodiments, the control is programmed to reduce a scan speed of deposition if the estimated temperature is lower than the lower desired temperature.

In another embodiment according to any of the previous embodiments, the control is programmed to develop an estimated temperature at an altered path and compared to the desired temperature.

In another embodiment according to any of the previous embodiments, the control is programmed to consider a desired micrograin structure and the path is modified to achieve a desired micrograin structure.

These and other features may be best understood from the following drawings and specification.

DETAILED DESCRIPTION

Additive manufacturing is generally known. As known, an additive manufacturing tool moves through a path, and lays down a plurality of layers of material to form a more complex three dimensional shape. Applicant has recognized that the current art selects the path but has not recognized that a "heat history" created by a path can result in defects in the formed parts. Thus, Applicant has developed a method and apparatus which considers a current heat state of areas along a path based upon past paths. This consideration may lead to alteration of the path, as will be described.

In general, a 3-D or computer model of the final shape is developed. This 3-D shape is then broken into a plurality of 2-D "slices" through which the additive manufacturing machine can move to form a 3-D product. A path is developed to form each of the slices.

Figure 1:
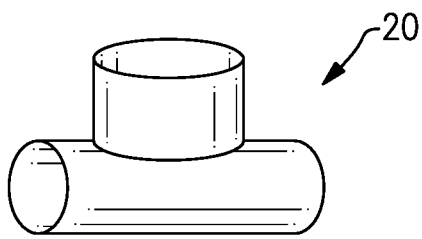
FIG. 1 schematically shows a three dimensional shape.
Figure 2:
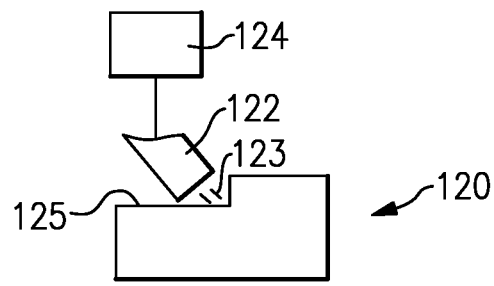
FIG. 2 shows the formation of the three dimensional shape at an intermediate point.

FIG. 2 schematically shows the formation of an intermediate part 120 which may become the part 20 of FIG. 1. As shown, a tool 122 is schematically shown depositing material into a particular slice.

It should be understood that additive manufacturing material 123 being deposited is often melted material. As such, additional heat is transferred to underlying material 125 which had previously been deposited. While some additional melting on previously deposited material 120 is desirable from the new material 123, there are also limits of what would be desirable.

A control 124 controls the path of the tool 122.

Figure 3A:
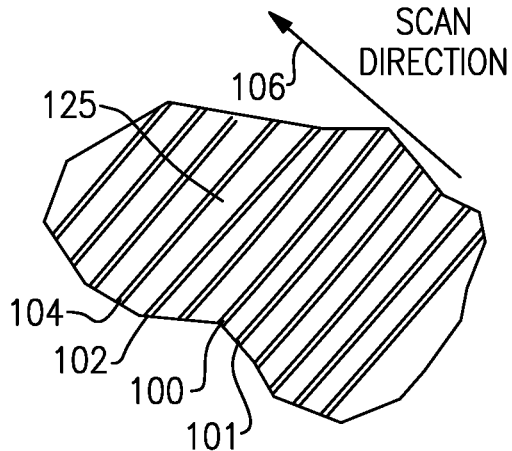
FIG. 3A shows a first challenge.

FIG. 3 shows a first concern in the prior art. A scan direction is illustrated. Extending along the scan direction are a plurality of temperature gradients 101, 100, 102, and 104. Dependent on how long it has been since the tool has passed along the gradient, the residual heat left in the underlying material 125 along the path 106 may vary. It is known that undue heat from the newly deposited material, combined with the residual temperature at the previously deposited material 125, can result in "keyhole" defects.

On the other hand, should the residual heat at the previously deposited material 125 be less than desirable, as the material 123 had not been deposited in that area for a longer period of time, then there may not be a sufficient amount of remelt on the previously deposited material 125. This can result in its own defects.

Figure 3B:
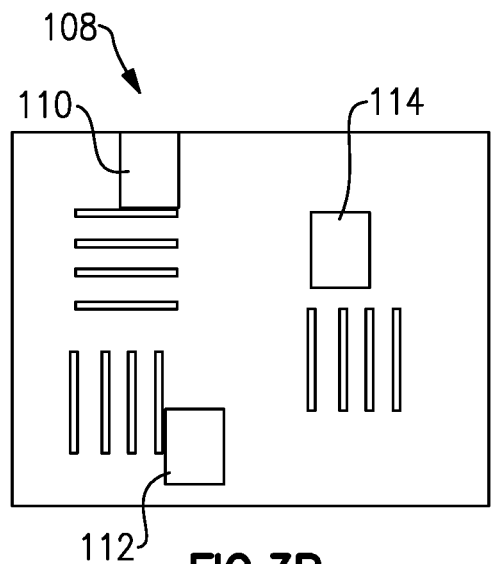
FIG. 3B shows a second challenge.

A further example is shown in FIG. 3B wherein a layer 108 is illustrated. Areas 110 and 112 may be subject to random deposition paths. However, since they are relatively close to each other, there is heat transfer which can result in too much heat. Another area 114 is spaced further from the areas 110 and 112, which this may be insufficient residual heat. Should this be a random deposition path, and the areas 110, 112, and 114 were selected in that order, there may be less heat than is desired at area 114 and too much heat at areas 110 and 112.

As will now be explained, this disclosure modifies a path as appropriate if these prior art concerns are seen.

Figure 4:
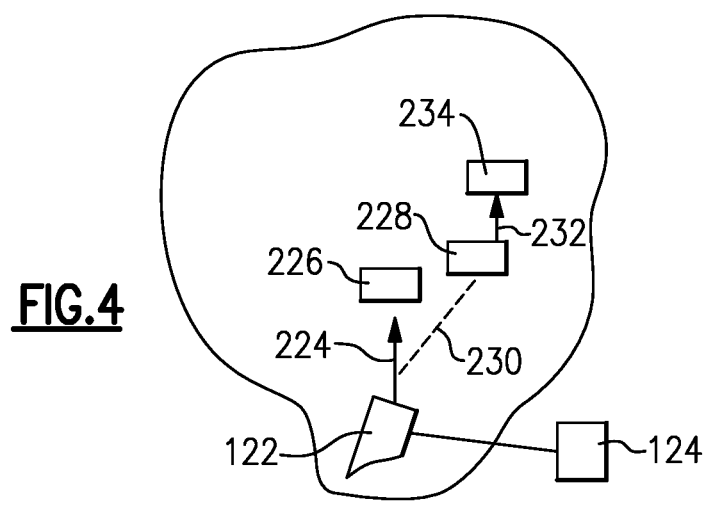
FIG. 4 shows an alternative path according to this disclosure.

As shown schematically in FIG. 4, a deposition tool 122 extends along a path 224. The path 224 is heading toward an area 226. If is determined that the area 226 has too much residual heat due to the deposition history, the control 124 can then alter the path as shown to head for area 228, rather than area 226.

In a further feature, a path 232 from the area 228 towards an area 234 is illustrated. If it is determined that area 234 has less residual heat than would be desired, the speed of the path 232 may be altered and, in particular, slowed to overcome the lack of residual heat issue.

Figure 5:
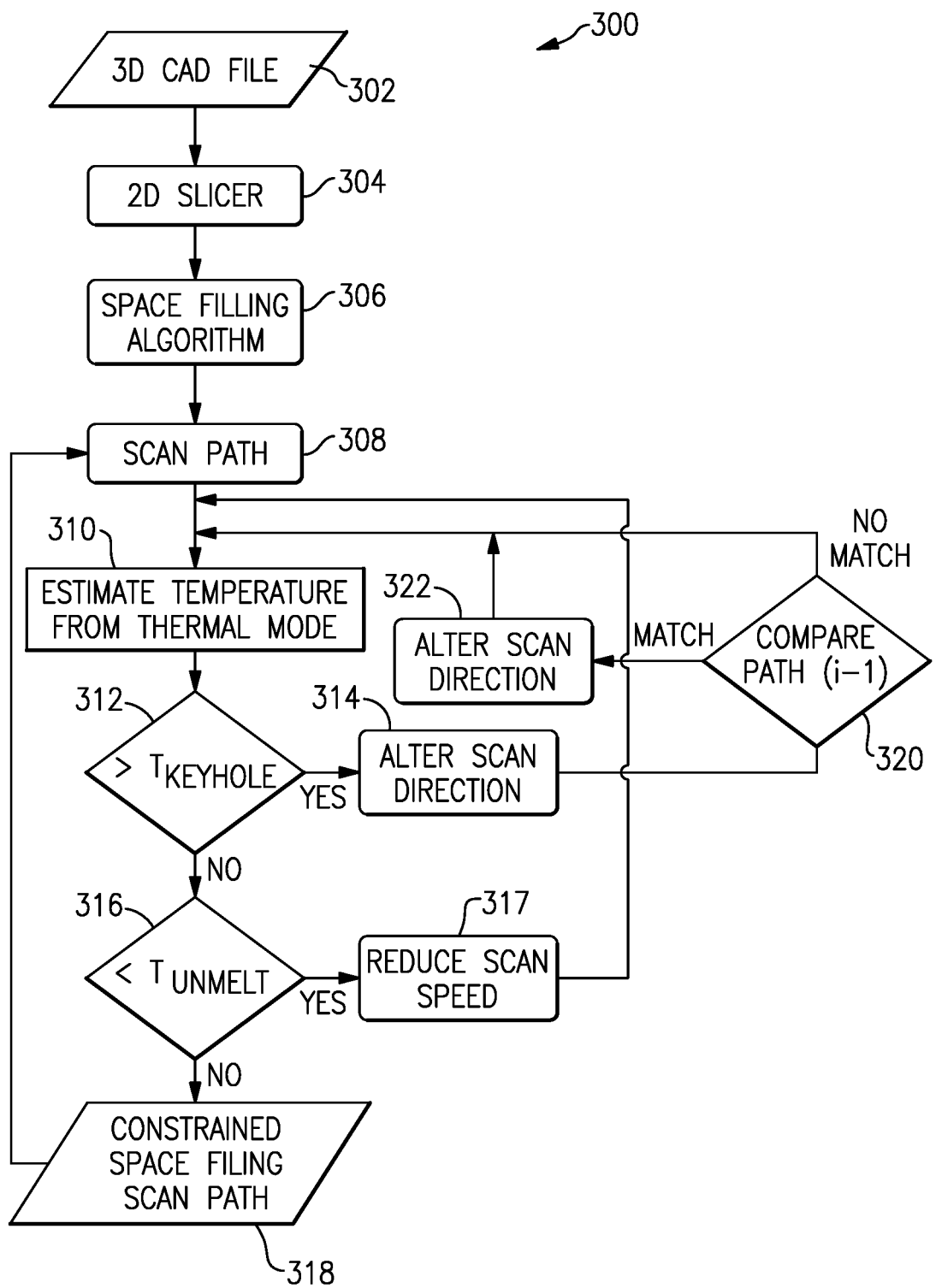
FIG. 5 is a flowchart.

A flowchart for this basic concept is illustrated in FIG. 5. The flowchart 300 shows a method which may be programmed into an appropriate controller that operates as control 124.

First, a 3-D CAD file 302 is developed for the final part to be manufactured. A 2-D slicer then slices the 3-D file into a plurality of slices at step 304.

A space filling algorithm 306 then determines how each of the 2-D slices should be manufactured by passing repeatedly across the area of each slice. It is important to ensure complete coverage. Then, at point 308, the tool is passed through a developed path, to scan and deposit the material. To this point the method as described is as known. Applicant has developed a method and apparatus to address the concerns as mentioned above.

With this disclosure, the history of the part's formation is addressed by considering temperature. Along each step of the path 308, an estimated temperature is developed from a thermal model at step 310. If the estimated temperature is greater than an undesirably high temperature (here, $T_{KEYHOLE}$) then the method moves to an alter scan direction step at 314.

However, if the temperature at the area being approached is not above the undesirable temperature ($T_{KEYHOLE}$), then the method moves to step 316.

At this point, the method considers whether the anticipated temperature is less than an undesirably low temperature ($T_{UNMELT}$). If it is less, then a scan speed is reduced at step 317. On the other hand, if step 316 does not detect an undesirably low temperature, then the path continues at step 318 back to step 308.

After step 314, the new scan direction (such as direction 230 in FIG. 4) is considered at step 320. If the path approximates a prior path, which has been determined to be undesirable at step 312, then the direction may again be altered at step 322. However, if the new path at step 320 does not match a prior path, then the method returns to step 310 and a temperature is estimated after the altered path from step 314. If step 322 occurs and the path must again be altered, the method again returns to step 310.

Any number of analytic methods may be utilized to estimate a spatial distribution of temperature. Existing models are known, which can consider heat distribution, maximum and minimum temperatures, constant temperature gradients, and cooling rates. As an example, one equation that might be utilized is set forth below.

$$T = T_0 + \frac{\dot{q}}{2\pi\lambda R}\exp\{-v(\xi + R)/(2\alpha)\}$$

(T=Temperature at any specific location, $T_0$=initial temperature, q̇=heat input, v=scan velocity, t=time, R=distance from heat source to a fixed point, ξ=scan direction coordinate in moving system, λ=thermal conductivity, α=thermal diffusivity)

The microstructure of the final part can also be controlled with this method. The concept of location specific microstructure control is based on parameters that are reliant on a relationship of grain-sized and temperature gradients. A thermal model can be used to compute temperature gradients and cooling rate as function of process parameter and material properties. An analytically developed melt pool size can be evaluated as a function of material properties and scan parameters. Numerical computations can be utilized to improve the fidelity and also to determine a calibration coefficient between numerical and analytical models. Based upon an approximation of the fixed number of grains inside a melt pool scan path and parameters can be altered to change a melt pool size and also to control final grain size.

A thermal model can be used to evaluate a cooling rate at any location, and the cooling rate can also be altered by altering scan path and parameters to control final microstructural features such as then dendrite size.

A method of providing additive manufacturing could be said to include the steps of developing a plurality of layers to result in a final shape product. Then a space filling algorithm is developed to develop a path. A temperature is estimated at a location along the path in an existing direction of the path. The estimated temperature is compared to a desired temperature and altering the existing direction of the path is altered should the estimated temperature differ from the desired temperature by a predetermined amount.

An additive manufacturing system could be said to include an additive manufacturing tool and a control for said additive manufacturing tool. The control is programmed to develop a plurality of layers to result in a final shape product, and develop a space filling algorithm to develop a path. The control can also estimate a temperature at a location along the path in an existing direction of the path. The control can compare the estimated temperature to a desired temperature and alter the existing direction of the path should the estimated temperature differ from the desired temperature by a predetermined amount.

An additive manufacturing system could be said to include an additive manufacturing tool and a control for said additive manufacturing tool. The control is programmed to develop a plurality of layers to result in a final shape product, and develop a space filling algorithm to develop a path. The control can also estimate a temperature gradient at a location along the path in an existing direction of the path. The control can compare the estimated temperature gradient to a desired temperature gradient and alter the existing direction of the path should the estimated temperature gradient differ from the desired temperature gradient by a predetermined amount.

Although an embodiment of this invention has been disclosed, a worker of ordinary skill in this art would recognize that certain modifications would come within the scope of this disclosure. For that reason, the following claims should be studied to determine the true scope and content of this disclosure.

The invention claimed is:

1. A method of providing additive manufacturing comprising the steps of:
   (a) developing a plurality of layers to result in a final shape product;
   (b) developing a space filling algorithm to develop a path;
   (c) estimating a temperature at a location along the path in an existing direction of the path; and
   (d) comparing the estimated temperature to a desired temperature and altering said existing direction of the path should said estimated temperature differ from said desired temperature by a predetermined amount.

2. The method as set forth in claim 1, wherein said direction of the path is altered should said estimated temperature be greater than a higher desired temperature.

3. The method as set forth in claim 2, wherein if said estimated temperature is not greater than said higher desired temperature, said estimated temperature to a lower desired temperature in a second comparison, and altering the direction of the path should said estimated temperature be lower than said lower desired temperature.

4. The method as set forth in claim 3, wherein a scan speed of movement along said portion is also altered based on said second comparison.

5. The method as set forth in claim 4, wherein an altered path direction is compared to prior paths, and if said altered path matches said prior paths, then an alternate altered path direction is developed.

6. The method as set forth in claim 5, wherein an estimated temperature at said altered path is estimated and the method returns to step (d).

7. The method as set forth in claim 6, wherein a consideration is made of a desired micrograin structure and said path is modified to achieve a desired micrograin structure.

8. The method as set forth in claim 1, wherein a scan speed of movement along said portion is also altered based on said second comparison.

9. The method as set forth in claim 8, wherein an altered path direction is compared to prior paths, and if said altered path matches said prior paths, then an alternate altered path direction is developed.

10. The method as set forth in claim 9, wherein an estimated temperature at said altered path is estimated and the method returns to step (d).

11. The method as set forth in claim 10, wherein a consideration is made of a desired micrograin structure and said path is modified to achieve a desired micrograin structure.

12. The method as set forth in claim 1, wherein an altered path direction is compared to prior paths, and if said altered path matches said prior paths, then an alternate altered path direction is developed.

13. The method as set forth in claim 1, wherein an estimated temperature at said altered path is estimated and the method returns to step (d).

14. The method as set forth in claim 1, wherein a consideration is made of a desired micrograin structure and said path is modified to achieve a desired micrograin structure.

15. An additive manufacturing system comprising:
   an additive manufacturing tool and a control for said additive manufacturing tool, said control being programmed to:
   (a) develop a plurality of layers to result in a final shape product;
   (b) develop a space filling algorithm to develop a path;
   (c) estimate a temperature at a location along the path in an existing direction of the path; and
   (d) compare the estimated temperature to a desired temperature and altering said existing direction of the path should said estimated temperature differ from said desired temperature by a predetermined amount.

16. The additive manufacturing system as set forth in claim 15, wherein said control is programmed to alter said direction of the path should said estimated temperature be greater than a desired temperature.

17. The additive manufacturing system as set forth in claim 16, wherein said control is programmed so that if said estimated temperature is not greater than said higher desired temperature, it compare said estimated temperature to a lower desired temperature, and alters a path should said estimated temperature be lower than said lower desired temperature.

18. The additive manufacturing system as set forth in claim 15, wherein said control is programmed to reduce a scan speed of deposition if said estimated temperature is lower than said lower desired temperature.

19. The additive manufacturing system as set forth in claim 15, wherein said control is programmed to develop an estimated temperature at an altered path and compared to said desired temperature.

20. The additive manufacturing system as set forth in claim 15, wherein said control is programmed to consider a desired micrograin structure and said path is modified to achieve a desired micrograin structure.

\* \* \* \* \*